United States Patent [19]
Larance

[11] Patent Number: 5,168,238
[45] Date of Patent: Dec. 1, 1992

[54] FUEL INJECTOR CIRCUIT TESTER WITH ROTATABLE MAGNIFYING LENS FOR VIEWING INDICATING LEDS

[76] Inventor: Coy Larance, 2601 N. Grand St., #218, Amarillo, Tex. 79107

[21] Appl. No.: 746,607

[22] Filed: Aug. 19, 1991

[51] Int. Cl.$^5$ .................... G01R 31/02; G01M 15/00
[52] U.S. Cl. .................................. 324/556; 324/402; 72/119
[58] Field of Search ............... 324/66, 378, 379, 384, 324/402, 556, 542; 359/440, 798, 802, 804, 808, 809, 811, 814, 609; 248/206.5, 467, 500; 73/119 A, 117.2

[56] References Cited

U.S. PATENT DOCUMENTS

| | | | |
|---|---|---|---|
| 4,071,174 | 1/1978 | Weiner | 359/804 |
| 4,542,335 | 9/1985 | Williams | 324/66 |
| 4,609,173 | 9/1986 | Belokin | 248/206.5 |
| 4,884,033 | 11/1989 | McConchie, Sr. | 324/542 |
| 5,015,072 | 5/1991 | Howell | 359/601 |

*Primary Examiner*—Gerard R. Strecker
*Assistant Examiner*—Diep Do
*Attorney, Agent, or Firm*—Leon Gilden

[57] ABSTRACT

A circuit tester for vehicle fuel injectors uses light emitting diodes which are individually illuminated by the pulse of electrical energy sent to each injector while the vehicles's engine is operating. The housing of the tester may be provided with a longitudinal slot in which a magnetically attached, moveable support for a magnifying lens is positioned. The lens may be positioned over any individual diode to allow viewing from a distance while performing engine tests, and a further moveable polarized filter can be positioned across the magnifying lens to improve the viewing capabilities.

1 Claim, 4 Drawing Sheets

FUEL INJECTOR CIRCUIT TESTER WITH ROTATABLE MAGNIFYING LENS FOR VIEWING INDICATING LEDS

BACKGROUND OF THE INVENTION

1. Field of the Invention

The present invention relates to circuit testers and more particularly pertains to a fuel injector circuit tester which may be utilized to test the operation of fuel injectors associated with an internal combustion engine.

2. Description of the Prior Art

The use of various types of circuit testers with respect to vehicle internal combustion engines is known in the prior art. For example, U.S. Pat. No. 4,006,403, which issued to Olsen et al on Feb. 1, 1977, discloses an engine performance analyzer which tests the operating characteristics of a vehicle's spark plugs, points, alternator and starter. Similarly, U.S. Pat. No. 4,186,337, which issued to Volk et al on Jan. 29, 1980, discloses an analyzer for a transistor ignition system associated with an automobile. This analyzer is designed to perform voltage, continuity, open circuit and dynamic signal substitution testing of each individual major component of an automotive-type transistor ignition system.

As can be appreciated, both of these prior art circuit testers are functional for their intended purposes and are quite representative of the current state of the art. However, both of these devices are substantially complex to manufacture and use, and are substantially expensive for the consuming public to purchase. The present invention substantially departs from the conventional concepts and designs of the prior art, and in so doing provides a circuit tester which is specifically designed to exclusively check fuel injector operation. As such, can be appreciated that there exists a continuing need for new improved circuit testers which are inexpensive to manufacture and easy to understand and use and which further can be designed for a very specific testing function. In this regard, the present invention substantially fulfills this need.

SUMMARY OF THE INVENTION

In view of the foregoing disadvantages inherent in the known types of circuit testers now present in the prior art, the present invention provides an improved circuit tester construction wherein the same can be utilized to exclusively test fuel injectors on internal combustion engines. As such, the general purpose of the present invention, which will be described subsequently in greater detail, is to provide a new and improved circuit tester which has all the advantages of the prior art circuit testers and none of the disadvantages.

To attain this, the present invention essentially comprises a circuit tester for vehicle fuel injectors which uses light emitting diodes that are individually illuminated by the pulse of electrical energy sent to each injector while the vehicle's engine is operating. The housing of the tester may be provided with a longitudinal slot in which a magnetically attached, moveable support for a magnifying lens is positioned. The lens may be positioned over any individual diode to allow viewing from a distance while preforming engine tests, and a further moveable polarized filter can be positioned across the magnifying lens to improve the viewing capabilities.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved fuel injector circuit tester which has all the advantages of the prior art fuel injector circuit testers and none of the disadvantages.

It is another object of the present invention to provide a new and improved fuel injector circuit tester which may be easily and efficiently manufactured and marketed.

It is a further object of the present invention to provide a new and improved fuel injector circuit tester which is of a durable and reliable construction.

An even further object of the present invention is to provide a new and improved fuel injector circuit tester which is susceptible of a low cost of manufacture with regard to both materials and labor, and which accordingly is then susceptible of low prices of sale to the consuming public, thereby making such fuel injector circuit testers economically available to the buying public.

Still yet another object of the present invention is to provide a new and improved fuel injector circuit tester which provides in the apparatuses and methods of the prior art some of the advantages thereof, while simultaneously overcoming some of the disadvantages normally associated therewith.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENTS

Figure 1:
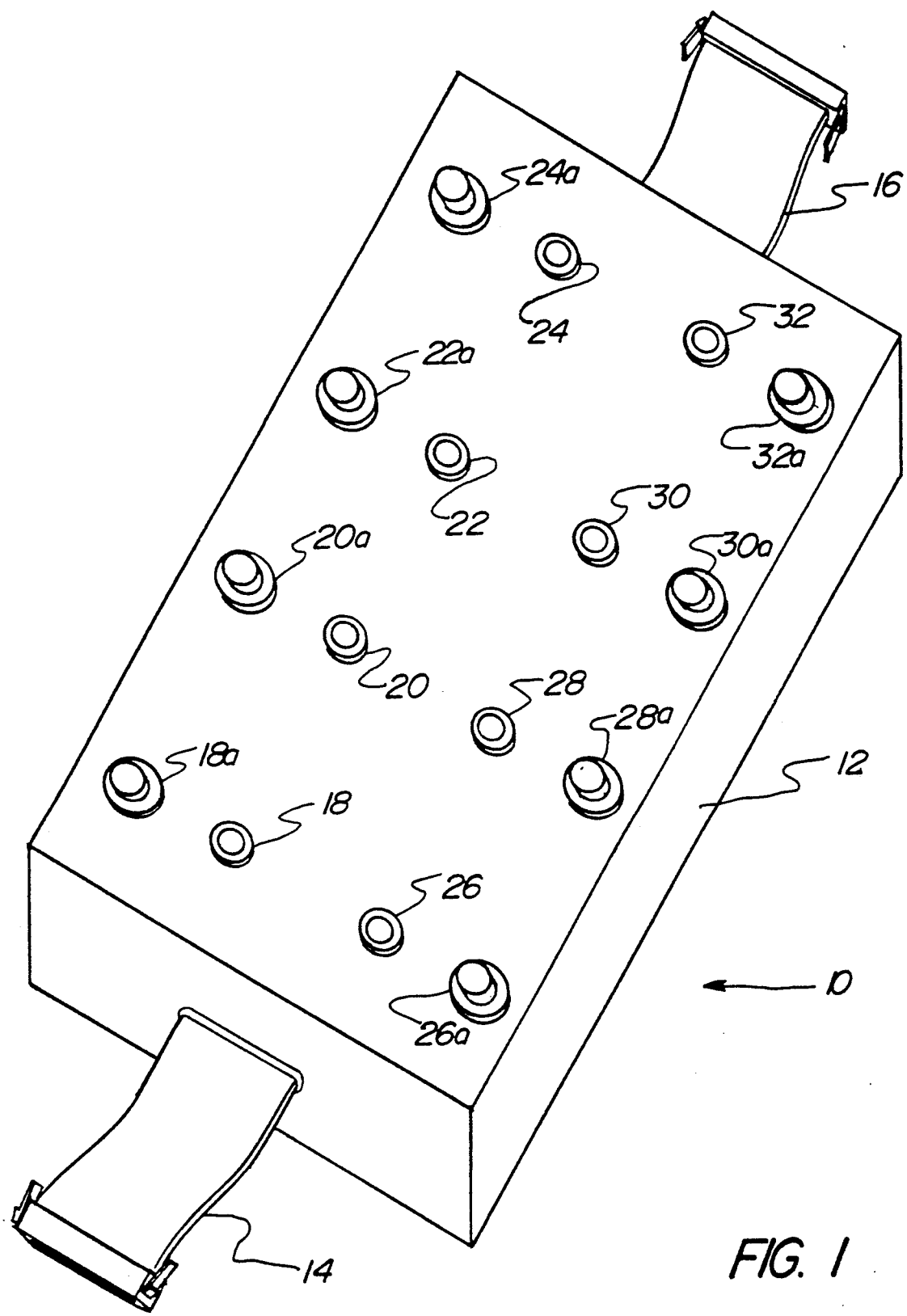
FIG. 1 is a perspective view of the fuel injector circuit tester comprising the present invention.

With reference now to the drawings, and in particular to FIG. 1 thereof, a new and improved fuel injector circuit tester embodying the principles and concepts of the present invention and generally designated by the reference numeral 10 will be described.

More specifically, it will be noted that the circuit tester 10 essentially comprises a housing 12 having a pair of electrical circuit connection cables 14, 16 extending from opposed ends thereof. The circuit tester 10 is designed for use on internal combustion engines having up to eight fuel injectors and accordingly, eight light emitting diodes (L.E.D.'s) 18-32 are illustrated as being mounted on a top surface of the housing 12. The respective light emitting diodes 18-32 are associated with respective push button switches 18a-32a.

Figure 2:
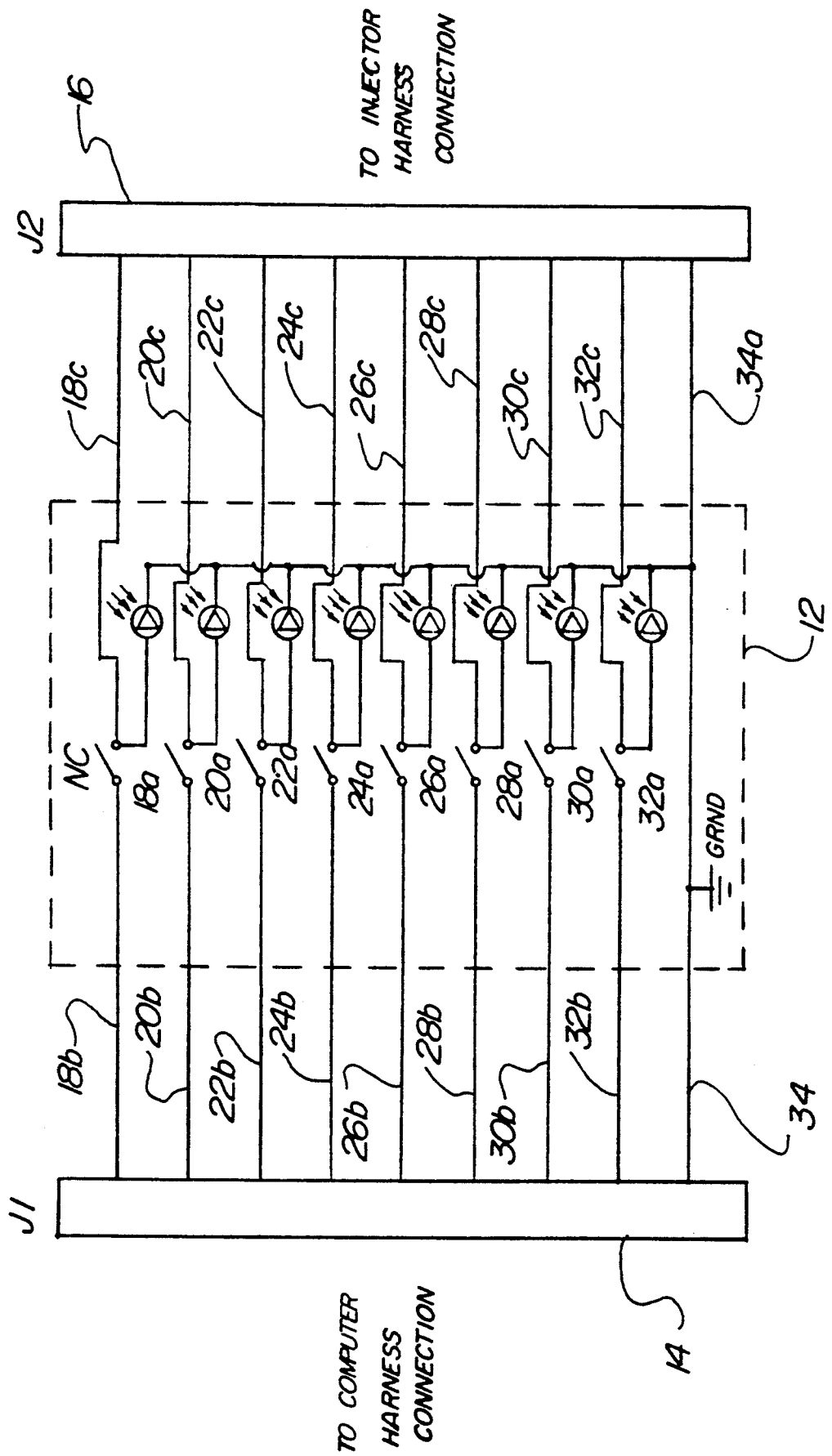
FIG. 2 is a circuit diagram illustrating the operation of the present invention.

FIG. 2 of the drawings illustrates the electrical circuit operation of the present invention 10. As shown, the electrical connection cable 14 effectively comprises a computer harness connection having electrical leads 18b-32b with lead 34 being directed to ground. Similarly, the electrical connection cable 16 effectively comprises an injection harness connection having respective leads 18c-32c with a common ground lead 34a. The leads 18b-32b and 18c-32c are respectively associated with the normally closed switches 18a-32a and as can be seen, the respective L.E.D.'s 18-32 are parallelly connected to their respective leads 18b-32b and 18c-32c in a now apparent manner.

In use, when a vehicle's computer sends an electrical pulse through any one of the electrical leads 18b-32b so as to activate the fuel injector associated therewith, all of the normally closed switches 18a-32a will permit the particular electrical pulse to pass on through the respective leads 18c-32c so as to not interrupt injector operation. Simultaneously, the parallel connection of each of the L.E.D.'s 18-32 will facilitate their individual illumination whenever an electrical pulse travels through the associated electrical lead. An operator can then determine that the fuel injector is receiving the electrical pulse to cause its operation. In the event that it is necessary to isolate a particular fuel injector by eliminating the electrical pulse thereto, a selective operation of the associated normally closed push button switch 18a-32a can result in an opening of the circuit directed to the particular injector. An open circuit will then be indicated by the non-illumination of the associated L.E.D.

Figure 3:
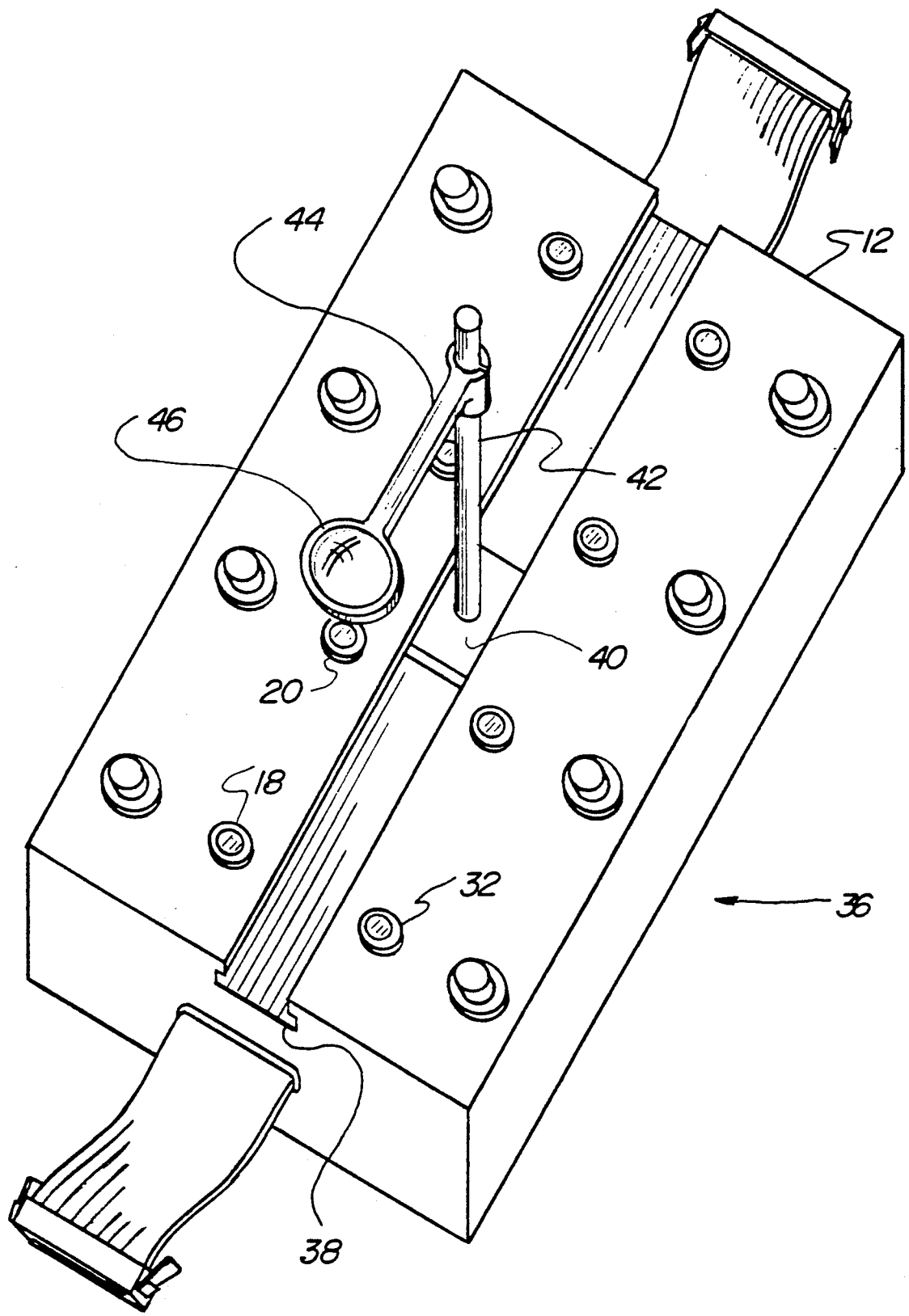
FIG. 3 is a perspective view of a modified embodiment of the invention.

FIG. 3 of the drawings illustrates a modified embodiment of the invention which is generally designated by the reference numeral 36. With this embodiment, the housing 12 of the invention is provided with a T-shaped slot 38 extending along an axial length thereof. Presuming that the housing 12 is manufactured from a ferromagnetic material, a moveable magnet 40 can be slidably positioned within the T-shaped slot 38, and an upstanding rod 42 may be fixedly secured to an exposed top surface of the magnet. A rotatable arm 44 may be slidably frictionally positioned over the rod 42 with a remote free end of the arm retaining a small magnifying lens 46. By the selective slidable movement of the magnet 40 and the rotatable positioning of the arm 44, the magnifying lens 46 can be positioned over any one of the eight light emitting diodes 18-32. This can be particularly useful in those situations where a user of the tester 36 is remotely positioned from the tester and is having some difficulty determining whether or not an individual light emitting diode is being periodically illuminated. In this regard, an enhanced viewing of the particular light emitting diode is afforded through a use of the magnifying lens 46.

Figure 4:
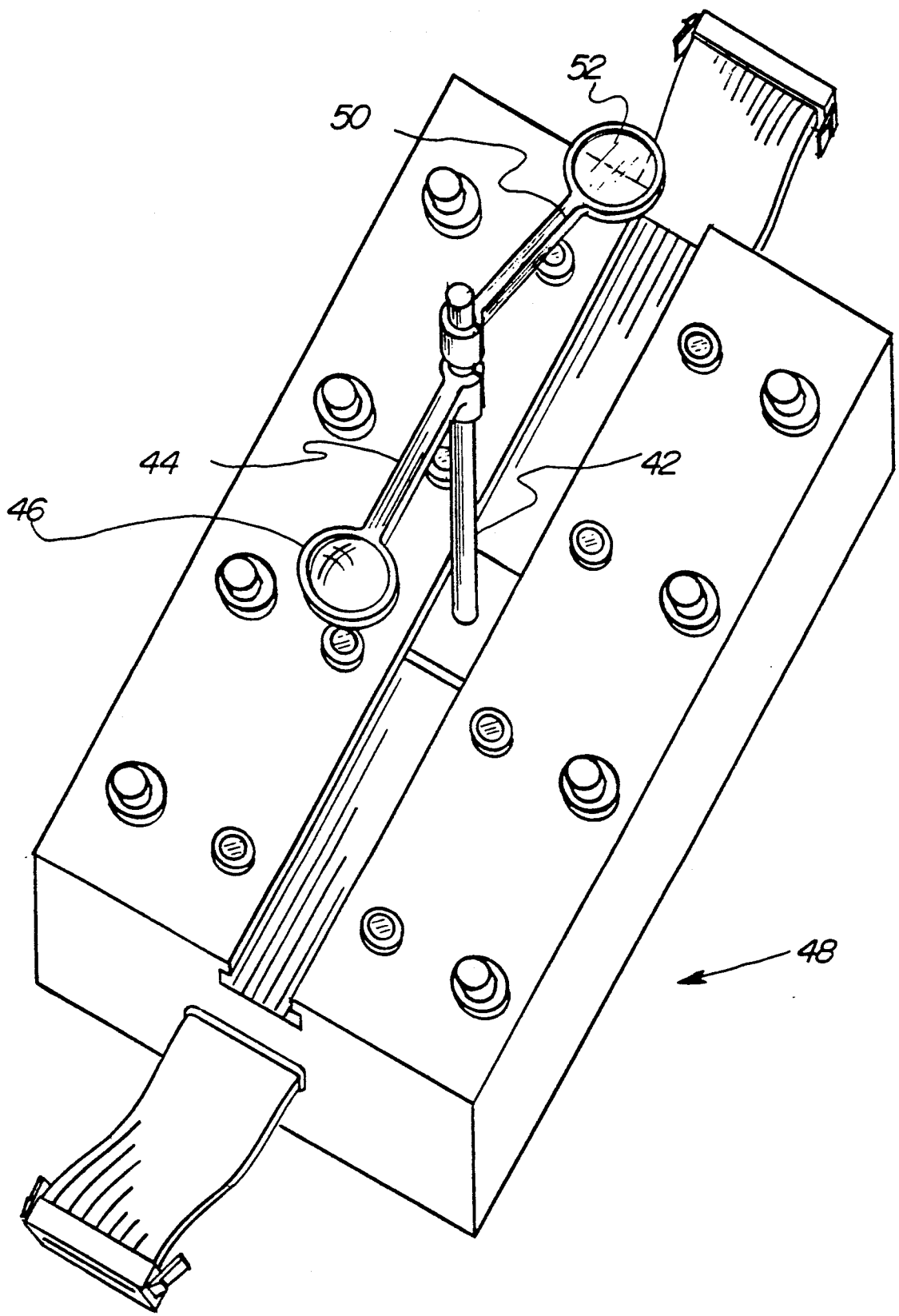
FIG. 4 is a perspective view of a further modified embodiment of the invention.

FIG. 4 of the drawings illustrates a further modified embodiment of the invention which is generally designated by the reference numeral 48. This embodiment 48 of the invention is essentially identical to the construction of the invention 36 illustrated in FIG. 3 with the exception that a second rotatably moveable arm 50 is positioned on the rod 42 above the arm 44. A polarizing filter 52 is retained on a remote free end of the arm 50 and can be rotated to a position overlying the magnifying lens 46. It has been found that this polarizing filter 52 is useful in those situations where a mechanic is testing an engine under bright light conditions since the filter operates to remove reflected glare off of the surface of the magnifying lens. An improved enhanced viewing function is then performed by combining the magnifying lens 46 with the polarizing filter 52.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. A fuel injector circuit tester comprising:
   housing means having a top surface;
   selectively operable illumination means retained in said housing means, visible from said top surface and being individually illuminable in response to a sensed electric pulse being delivered to a selected fuel injector associated with an internal combustion engine, said illumination means comprising a plurality of light emitting diodes;

switch means for facilitating a selective closing of electric circuits associated with said illumination means, said switch means including a plurality of individually operable push button switches associated with respective ones of said plurality of light emitting diodes, thereby to permit a delivery of said electric pulse to a selected one of said plurality of light emitting diodes;

a T-shaped slot formed in said top surface along an axial length of said housing means, said T-shaped slot operably retaining a slidably moveable magnet to which an upstanding support pole is attached, said slidably moveable magnet being selectively positionable within said T-shaped slot so as to selectively vary a positioning of said upstanding support pole, said movable magnet comprising a base member for said upstanding support pole and being further retained within said T-shaped slot by side edge portions of said T-shaped slot;

a magnifying lens rotatably attached to said upstanding support pole, said magnifying lens being retained within an arm structure rotatably mounted on said upstanding support pole, whereby said magnifying lens may be selectively positioned over one of said plurality of light emitting diodes;

light filtering means rotatably attached to said pole, said light filtering means being selectively positionable over said magnifying lens to facilitate an enhanced viewing of one of said light emitting diodes; and electrical harness means for interconnection between a vehicle's fuel control computer and a plurality of fuel injectors, said illumination means being serially connected to individual electrical leads within said harness means.

* * * * *